United States Patent [19]
Nguyen

[11] Patent Number: 5,994,967
[45] Date of Patent: Nov. 30, 1999

[54] OSCILLATOR CIRCUIT EMPLOYING FREQUENCY-LOCKED LOOP FEEDBACK TOPOLOGY

[75] Inventor: Cong Dinh Nguyen, Sachse, Tex.

[73] Assignee: Dallas Semiconductor Corporation, Dallas, Tex.

[21] Appl. No.: 08/904,094

[22] Filed: Jul. 31, 1997

[51] Int. Cl.$^6$ ...................................................... H03L 7/00
[52] U.S. Cl. ........................... 331/1 R; 331/49; 331/176; 331/74; 331/177 R
[58] Field of Search .................. 331/177 R, 49, 331/1 R, 74, 175, 176

[56] References Cited

U.S. PATENT DOCUMENTS

| | | | |
|---|---|---|---|
| 3,852,681 | 12/1974 | Underhill | 331/1 R |
| 5,594,388 | 1/1997 | O'Shaughnessy et al. | 331/1 R |
| 5,673,005 | 9/1997 | Pricer | 331/1 R |

*Primary Examiner*—Arnold Kinkead
*Attorney, Agent, or Firm*—Jenkens & Gilchrist P.C.

[57] ABSTRACT

An integrated, crystalless oscillator includes a voltage controlled oscillator circuit for generating an output signal, and a frequency-locked feedback network to stabilize the frequency of the output signal. The frequency-locked feedback network includes a divide-down circuit and a frequency-controlled variable resistor, the divide-down circuit divides down the frequency of the output signal to produce a feedback frequency which is used to control the frequency-controlled variable resistor. The control voltage for the voltage controlled oscillator circuit is derived from the voltages across a fixed resistor and the frequency-controlled variable resistor. The voltages across these resistors drive an amplifier, with the output of the amplifier being the control voltage for the voltage controlled oscillator circuit.

5 Claims, 2 Drawing Sheets

OSCILLATOR CIRCUIT EMPLOYING FREQUENCY-LOCKED LOOP FEEDBACK TOPOLOGY

FIELD OF THE INVENTION

This invention relates to oscillator circuits, and more particularly, but not by way of limitation, to crystalless oscillator circuits employing frequency-locked loop feedback topology to stabilize the frequency of the generated output signal.

BACKGROUND OF THE INVENTION

There is a wide commercial market available for the use of high performance electronic real time clocks. One significant feature requirement of high performance electronic real time clocks is the use of a crystal to generate the time base for the oscillator circuitry. For example, a conventional prepackaged crystal oscillator includes a quartz crystal to provide the frequency reference, and an oscillator amplifier to excite the crystal to resonance, while other crystal oscillator circuit packages utilize an external quartz crystal. However, as the consumer need for more powerful, smaller and less expensive electronic systems continues to be a driving force behind many new products and systems that don't need quite the accuracy of a crystal oscillator but do need a relatively precise oscillator, the cost and size of conventional crystal oscillator real time clocks makes them prohibitive.

One solution to the conventional crystal oscillator has been through the use of the RC oscillator circuit. Although this has proven to be a somewhat acceptable solution for systems which require low performance oscillator circuits, it has fallen short for systems requiring the high performance such as in computer systems. This is primarily because RC oscillator circuits are not very stable during operation. The reason RC oscillator circuits are not as stable as crystal oscillator circuits is due to the lack of a stable oscillator element for use by the conventional RC oscillator circuits to phase-lock to or to count down from. As with crystal oscillators, RC oscillator circuits also take up too much pc-board area.

Accordingly, based upon the foregoing, it should be understood and appreciated that there is a need for a low power, monolithic crystalless integrated circuit oscillator that provides an output signal with comparable frequency stability with that of conventional crystal oscillators.

SUMMARY OF THE INVENTION

The present invention overcomes the above identified problems as well as other shortcomings and deficiencies of existing technologies by providing a low power, monolithic integrated circuit crystalless oscillator utilizing a frequency-locked loop feedback topology to stabilize the frequency of a generated output signal.

The present invention further provides an integrated, crystalless oscillator having a voltage controlled oscillator circuit for generating an output signal, and a frequency-locked feedback network to stabilize the frequency of the output signal. The frequency-locked feedback network includes a divide-down circuit and a frequency-controlled variable resistor. The divide-down circuit divides down the frequency of the output signal to produce a feedback frequency which is used to control the resistance value of the frequency-controlled variable resistor. A control voltage for driving the voltage controlled oscillator circuit is derived from the voltage across a fixed resistor and the voltage across the frequency-controlled variable resistor. The voltages across these resistors drive an amplifier, with the output of the amplifier being the control voltage for the voltage controlled oscillator circuit.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION

Figure 1:
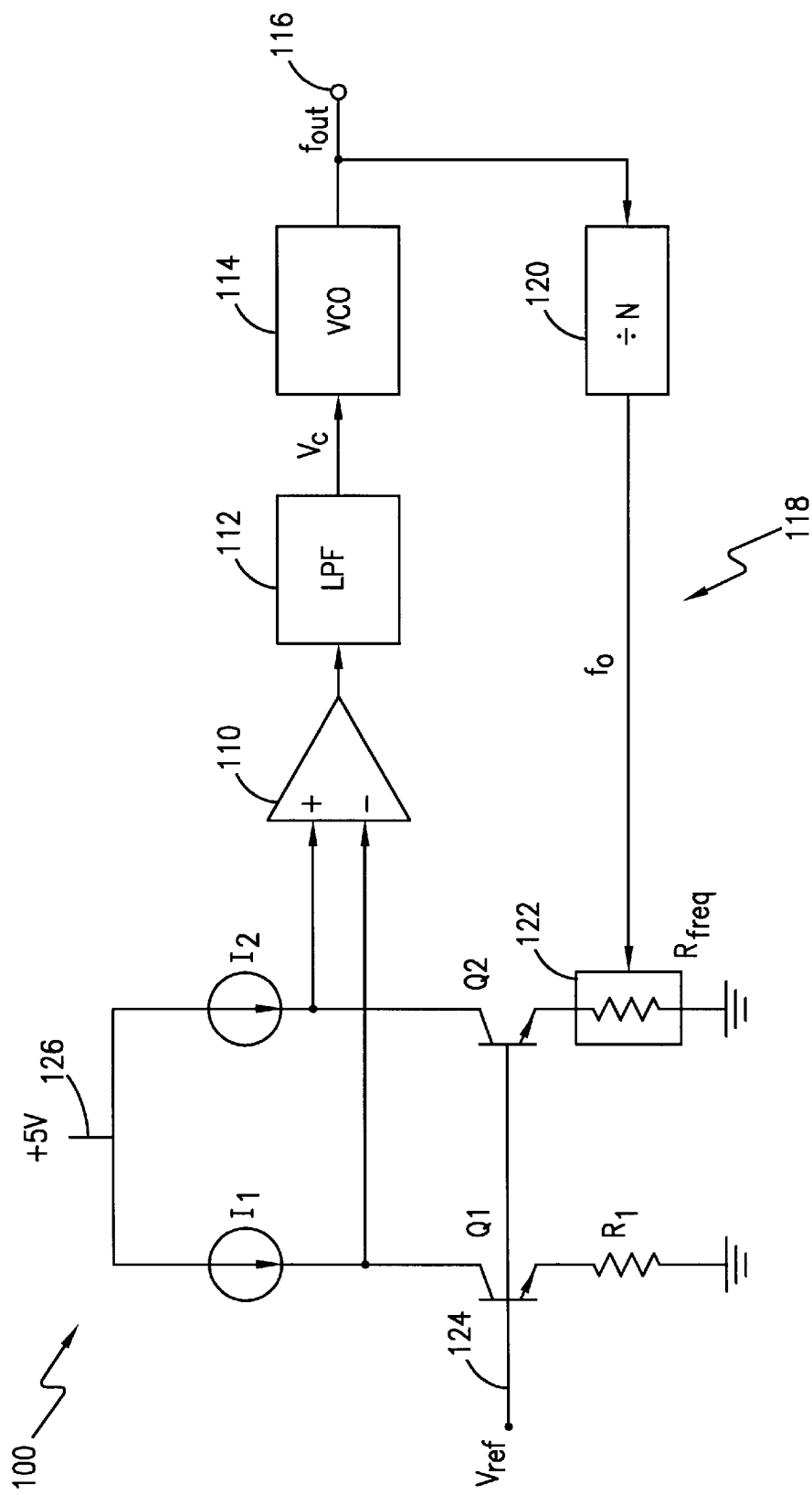
FIG. 1 is a schematic diagram illustrating an embodiment of an oscillator circuit in accordance with the teachings of the present invention.

With reference now to FIG. 1, there is illustrated a schematic diagram illustrating an exemplary embodiment of an oscillator circuit 100. As depicted oscillator circuitry 100 includes two current sources, $I_1$ and $I_2$, each being connected to the inputs of difference amplifier 110. The output of difference amplifier 110 is connected to the input of a low pass filter 112. The output of low pass filter 112 is connected to the input of a voltage controlled oscillator 114. The output of voltage controlled oscillator 114 is connected to the output 116 of oscillatory circuit 100. A frequency-lock feedback loop 118 is connected between output 116 and an input of difference amplifier 110. Frequency-lock feedback loop 118 includes a divide-by-N circuit 120, a frequency-controlled resistor $R_{freq}$ 122, and a transistor $Q_2$. Oscillator circuit 100 further includes an input 124 for receiving a reference voltage, an input 126 for receiving operating voltage, transistor $Q_1$, and resistor $R_1$. A detailed description of the operation of oscillator circuit 100 is given herein below.

Figure 2:
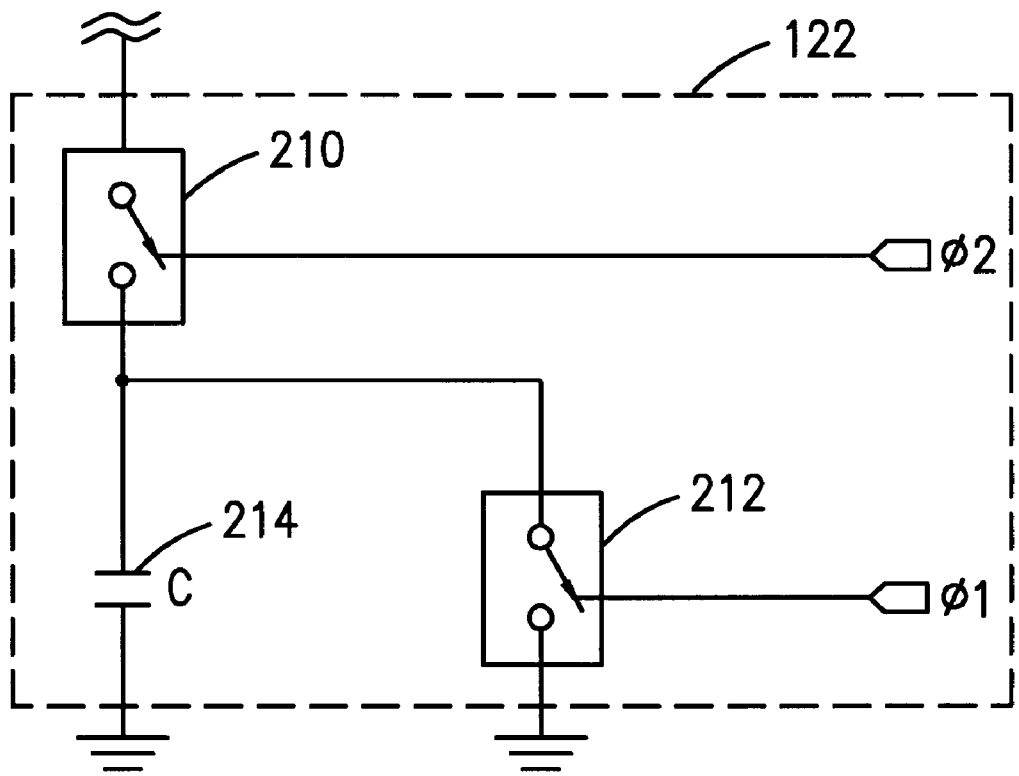
FIG. 2 is a schematic diagram illustrating an exemplary embodiment of the frequency-controlled resistor utilized in the present invention.

Referring now to FIG. 2, there is illustrated an exemplary embodiment of frequency-controlled resistor $R_{freq}$ 122. As depicted, frequency-controlled resistor $R_{freq}$ 122 is a switched-capacitor circuit, including switches 210 and 212, and capacitor 214.

Referring now to FIGS. 1 and 2, the operation of oscillator circuit 100 will now be described. The output of voltage controlled oscillator 114, $f_{out}$, is the output of oscillator circuit 100. Divide-by-N circuit 120 divides down the frequency of the output signal of voltage controlled oscillator 114 to produce the feedback frequency signal, $f_o$, which is utilized in feedback loop 118 to stabilize and control the output frequency $f_{out}$.

A control voltage $V_C$ for driving voltage controlled oscillator 114, is derived from resistors $R_1$ and $R_{freq}$. Resistors $R_1$ and $R_{freq}$ are fed by current sources $I_1$ and $I_2$, such that the voltages across resistors $R_1$ and $R_{freq}$ drive difference amplifier 100. The output of difference amplifier 110 is fed into low pass filter 112. Low pass filter 112 is used to remove high-frequency noise from the output of amplifier 110. The output of low pass filter 112 is the control voltage $V_C$ for voltage control oscillator 114.

In this exemplary embodiment, frequency-controlled resistor, $R_{freq}$, is a switched-capacitor circuit, as is illustrated in FIG. 2. Switches 210 and 212 turn on and off with alternate non-overlapping phases $\phi 1$ and $\phi 2$ of the feedback frequency $f_o$. The charge Q on the switched-capacitor 214 is given by the equation:

$Q=CV.$

The current running through the switched-capacitor 214 is given by the equation:

$$I=C(dV/dT)=CV/T$$

where T is defined as $1/f_o$. As a result, the current is equal to $f_o CV$. Because $R=V/i$, the effective resistance of $R_{freq}=1/f_o C$, where C is the value of the capacitor in switched capacitor 214. Therefore as the output frequency $f_o$ increases, the resistance value of $R_{freq}$ decreases. As a result, the voltage at the plus input of the difference amplifier drops, reducing the value of the control voltage $V_C$ received by voltage controlled oscillator 114. And, because the output frequency, $f_{out}$, of voltage control oscillator 114 is directly proportional to the control voltage $V_C$, the output frequency, $f_{out}$, will decrease when the resistance value of $R_{freq}$ decreases. When the resistance value of $R_{freq}$ equals the resistance value of $R_1$, feedback loop 118 is in a "lock" condition and the control voltage $V_C$ will remain constant. When $V_C$ remains constant, the output frequency $f_{out}$ is also constant. Because oscillator circuit 100 is a standalone oscillator, there is no external reference frequency onto which oscillator 100 can "lock", as is the case with phase-locked loop (PLL) circuits.

The output frequency $f_{out}$ of oscillator circuit 100 is given by the equation:

$$f_{out}=N/(R_1 C)$$

Therefore, the output frequency $f_{out}$ of oscillator circuit 100 is determined by the value of N (the frequency divider number of divide-by-N circuit 120), the resistance value of $R_1$, and the value of capacitor 214.

By operating resisters $R_1$ and $R_{freq}$ from current sources $I_1$ and $I_2$, along with the frequency-lock feedback loop 118, a low voltage sensitivity is maintained, so long as the open-loop gain of amplifier 110 is high.

In an exemplary embodiment of oscillator circuit 100, good results have been achieved by maintaining constant values for N of divide down circuit 120, and the capacitance C of the capacitor 214, with the resistance of $R_1$ being trimmed with programmable-resistor technology, and the trim values stored in an EEPROM. The stability of oscillator circuit 100 runs close to that of a crystal oscillator circuit using PLLs. Although, the temperature and voltage coefficients of oscillator circuitry 100 are very low, good results have been achieved by using a reference voltage, $V_{ref}$ 124, to compensate therefor.

Those skilled in the art can realize that the teachings of the present invention as described hereinabove provides a low powered monolithic integrated circuit crystalless oscillator utilizing a voltage controlled oscillator to generate an output signal and employing a frequency-locked feedback topology to stabilize the frequency of the output signal.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A circuit for generating an output signal having a stabilized frequency, said circuit comprising:

a voltage controlled oscillator having an input and an output, said voltage controlled oscillator for generating the output signal at said output, said input for receiving a control voltage for driving said voltage controlled oscillator;

a frequency-locked feedback network including a variable resistor, said frequency-locked feedback network connected to said input of said voltage controlled oscillator and to said output of said voltage controlled oscillator, said frequency-locked feedback network for controlling the frequency of the output signal;

a power input for receiving a supply voltage;

an amplifier having first and second inputs and an output, said first input of said amplifier connected to said power input, said second input of said amplifier connected to said frequency-locked feedback network, and said output connected to said input of said voltage controlled oscillator; and a lower pass filter connected between said output of said amplifier and said input of said voltage controlled oscillator.

2. The circuit as recited in claim 1, wherein said variable resistor is a frequency controlled resistor.

3. The circuit as recited in claim 2, wherein said frequency controlled resistor includes a switched capacitor circuit.

4. The circuit as recited in claim 2, wherein said frequency-locked feedback network includes a dividing circuit connected to receive the output signal, said dividing circuit for dividing down the frequency of the output signal.

5. A crystalless oscillator for generating an output signal having a stabilized frequency, said circuit comprising:

an oscillator circuit having an input and an output, said oscillator circuit for generating the output signal at said output, said input for receiving a voltage for driving said oscillator circuit;

a feedback network including a frequency-controlled variable resistive element, said feedback network connected to said input of said oscillator circuit and to said output of said oscillator circuit, said feedback network for controlling the frequency of the output signal;

a power input for receiving a supply voltage;

an amplifier having first and second inputs, and an output, said first input connected to said power input, said second input connected to said frequency-controlled variable resistive element, and said output connected to said input of said oscillator circuit;

a low pass filter connected between said output of said amplifier and said input of said oscillator circuit; and said feedback loop includes a dividing circuit connected between said frequency-controlled variable resistive element and said output of said oscillator circuit, said dividing circuit for dividing the frequency of the output signal received from the output of said oscillator circuit.

* * * * *